United States Patent [19]

Lin

[11] Patent Number: 4,797,622

[45] Date of Patent: Jan. 10, 1989

[54] TECHNIQUE FOR DETERMINING THE VALUES OF CIRCUIT ELEMENTS IN A THREE TERMINAL EQUIVALENT CIRCUIT

[75] Inventor: Chia-Lung Lin, Matawan, N.J.

[73] Assignee: American Telephone and Telegraph Company AT&T Bell Laboratories, Murray Hill, N.J.

[21] Appl. No.: 33,445

[22] Filed: Apr. 1, 1987

[51] Int. Cl.[4] .................. G01R 31/08; H04M 3/44
[52] U.S. Cl. .................. 324/537; 324/522; 371/6; 371/26
[58] Field of Search .......... 324/133, 509, 539, 541, 324/158 T, 72.5, 537, 522, 523, 525; 379/1, 2, 21, 24, 26, 27, 30, 32, 6

[56] References Cited

U.S. PATENT DOCUMENTS

| | | | |
|---|---|---|---|
| 4,410,850 | 10/1983 | Pesto et al. | 379/26 X |
| 4,424,479 | 1/1984 | Brown | 379/26 X |
| 4,501,935 | 2/1985 | Gray | 179/175 |
| 4,538,105 | 8/1985 | Ausschnitt | 324/65 R X |
| 4,578,761 | 3/1986 | Gray | 364/481 |
| 4,714,874 | 12/1987 | Morris et al. | 324/65 R |

OTHER PUBLICATIONS

Hayt, Jr. Engineering Circuit Analysis, 1978, pp. 538–541.

Primary Examiner—Reinhard J. Eisenzopf
Assistant Examiner—Jack B. Harvey
Attorney, Agent, or Firm—David R. Padnes

[57] ABSTRACT

A technique which improves the accuracy of determining the circuit element values in a three terminal equivalent circuit is disclosed. The improvement results from the use of at least one ratio wherein the numerator and denominator of each ratio is a different function of at least one measurement of the three terminal equivalent circuit. Each ratio is representative of the true value of one preselected circuit element to another preselected circuit element value. This technique can be used for DC or AC analysis of the equivalent circuit and can be adapted for different sources of measurement errors.

20 Claims, 6 Drawing Sheets

| MEASUREMENT STEP | SOURCE LEVEL | SIGNAL SOURCE SIDE | METER MEASUREMENT SIDE | MEASURED RESULTS |
|---|---|---|---|---|
| 1 | $V_{rs1}$ | RING TO GRD | RING TO TIP | $V_{ra1}$ |
| 2 | $V_{rs1}$ | RING TO GRD | TIP TO GRD | $V_{rb1}$ |
| 3 | $V_{rs2}$ | RING TO GRD | RING TO TIP | $V_{ra2}$ |
| 4 | $V_{rs2}$ | RING TO GRD | TIP TO GRD | $V_{rb2}$ |
| 5 | $V_{ts1}$ | TIP TO GRD | TIP TO RING | $V_{ta1}$ |
| 6 | $V_{ts1}$ | TIP TO GRD | RING TO GRD | $V_{tb1}$ |
| 7 | $V_{ts2}$ | TIP TO GRD | TIP TO RING | $V_{ta2}$ |
| 8 | $V_{ts2}$ | TIP TO GRD | RING TO GRD | $V_{tb2}$ |

TECHNIQUE FOR DETERMINING THE VALUES OF CIRCUIT ELEMENTS IN A THREE TERMINAL EQUIVALENT CIRCUIT

TECHNICAL FIELD

This invention relates to a technique for identifying circuit faults in a communications network by determining the values of circuit elements in a three terminal equivalent circuit and, more particularly, to an improved method and apparatus which more accurately determines these circuit element values.

BACKGROUND OF THE INVENTION

Telecommunications systems utilize numerous conductor pairs encompassed within a nonconductive sheath; the sheath also contains a continuous metallic shield so that cable may be grounded periodically to mitigate interference. The conductors of a pair are typically referred to as the tip and ring conductors. The tip and ring, together with circuit ground constitute a three-wire transmission line. Such a transmission line together with a variety of interconnected equipment provides a myriad of communications services.

The identification of circuit faults in telecommunications systems is a difficult task due to the many different circuit arrangements. To facilitate the identification process, a three terminal equivalent or delta circuit is synthesized which is representative of the three-wire transmission line. The synthesized circuit has circuit elements which vary with the particular equipment connected to the three-wire transmission line. The values of these circuit elements are determined by performing different measurements of the three-wire transmission line. By determining the values of the circuit elements in the three terminal equivalent circuit using well-known techniques, faults in the actual circuit can often be identified. While this fault identification technique has long been used and provides satisfactory results, improper fault identifications do occur. Such errors typically arise when the value of one circuit element in the three terminal equivalent circuit is substantially different from the others. As a result of such improper fault identifications, incorrect selection of follow-up measurements, strategies or even false dispatches of repair forces can result. Accordingly, a technique which reduces errors in the determination of the circuit element values in a three terminal equivalent circuit would be highly desirable.

SUMMARY OF THE INVENTION

In accordance with the present invention, the values of circuit elements in a three terminal equivalent circuit can be more accurately determined. This three terminal equivalent circuit is representative of an actual circuit. Pursuant to the present invention, predetermined signals are applied to the actual circuit being tested and measurements are performed. Using these measurements, at least one ratio is formed, the numerator and denominator of each ratio being a different function of at least one of the measurements. Each ratio is representative of a ratio of the value of one preselected circuit element to another preselected circuit element value in the three terminal equivalent circuit. Using the ratios formed and the measurements taken, the values of the circuit elements in the three terminal equivalent circuit are determined.

An aspect of the present invention is that it is applicable to both AC or DC characterization of a three terminal equivalent circuit. Another aspect of the present invention is that it can be adapted to compensate for different sources of measurement error. Still another aspect of the present invention is that it can be used alone or in combination with prior art analysis of a three terminal equivalent circuit.

DETAILED DESCRIPTION

Figure 1:
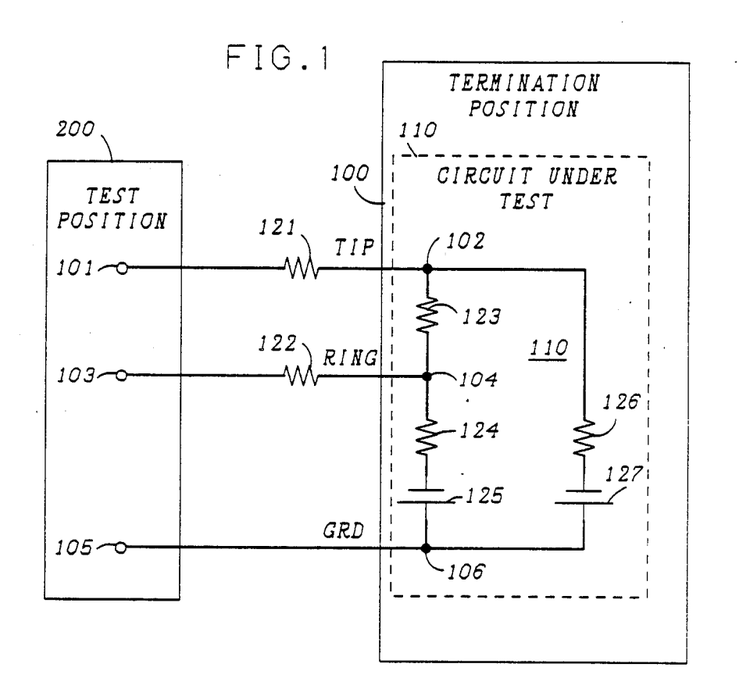
FIG. 1 is a general representation of a three terminal equivalent circuit for a circuit under test at a termination point.

A three-wire transmission line, comprising a tip conductor with terminal nodes 101 and 102, a ring conductor with terminal nodes 103 and 104 and a circuit ground with nodes 105 and 106, is shown in FIG. 1 connecting a test position 200 and a remotely-located termination position 100. The DC resistance of the tip conductor and ring conductor between positions 100 and 200 is designated by resistors 121 and 122, respectively. In most situations, resistors 121 and 122 have substantially the same value.

The illustrative circuit under the test having a termination position 100 can be synthesized by a three terminal equivalent circuit 110. Circuit 110 comprises tip-ring resistor 123, ring-ground resistor 124 in series with a DC source 125, and tip-ground resistor 126 in series with another DC source 127. Each DC source in FIG. 1 is represented by a battery. This DC three terminal equivalent circuit is representative of a class of telecommunications circuits which are tested. Moreover, if the DC sources 125 and 127 are set to zero, then the three terminal equivalent circuit represents other passive networks, such as a coin telephone, which can be conducted to a three terminal transmission line. In addition, by substituting an impedance for each resistor, an AC three terminal equivalent circuit results, which also can be analyzed to determine circuit faults in a class of telecommunications circuits which are tested.

Figure 2:
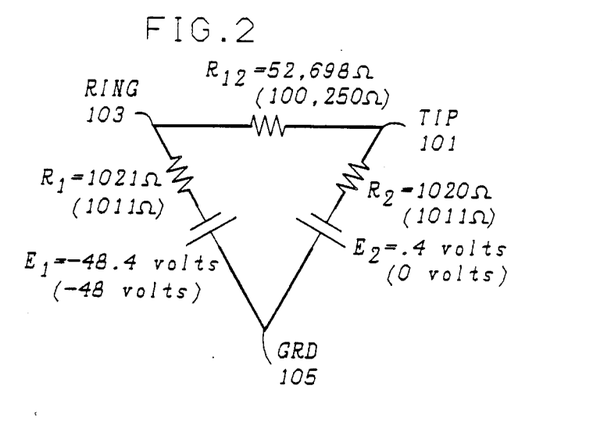
FIG. 2 is a representation of a particular three terminal equivalent circuit and the circuit element values obtained by conventional techniques vis-á-vis their true values.

Now, refer to FIG. 2. Using conventional techniques, the circuit element values for the three terminal equivalent circuit can be determined using measurements taken at test position 200 in a well-known fashion. In this analysis and those which follow, the tip and ring resistors 121 and 122 are combined with the other resistors, 123, 124 and 126 to arrive at the three terminal equivalent circuit of FIGS. 2 and 3. This combination provides no limitation as the values of resistors 121 and 122 can be readily subtracted from the determined circuit element values to obtain the corresponding circuit element values of three terminal equivalent circuit 110. It should be noted that the determined values of R1=1021 ohms and R2=1020 ohms are close to the true value of 1011 ohms. However, the determined value of R12 is substantially different from its true value. This significant error arises whenever one circuit element value in the three terminal equivalent circuit is significantly different from the others.

Figure 3:
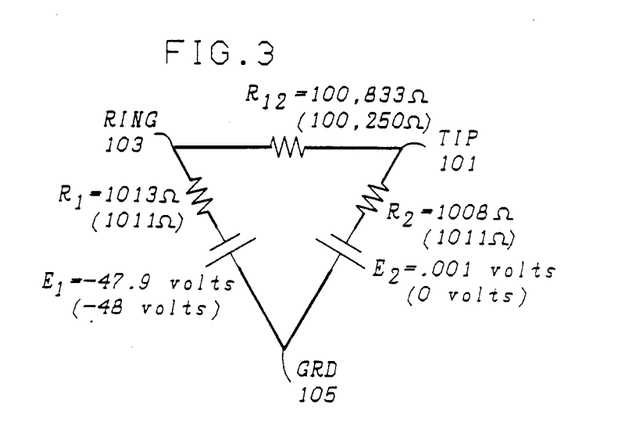
FIG. 3 is the three terminal equivalent circuit of FIG. 2 showing the circuit element values obtained using the present invention and their true values.

FIG. 3 shows the improved accuracy in the determined circuit element values resulting from the use of the present invention which utilizes at least one ratio, the numerator and denominator of each ratio being a different function of at least one of the measurements determined at test position 200. This ratio is then used to determine the values of the circuit elements. Each ratio of the measurement functions is representative of the ratio of the true values of one selected circuit element to another in the three terminal equivalent circuit. The accuracy of the measurement function ratio to the ratio of the true values of the selected circuit elements varies with the internal resistance of the measuring equipment. Ideally, i.e., in the absence of such internal resistance and measurement error, each ratio of the measurement functions is equal to the ratio of selected circuit element values.

Figure 4:
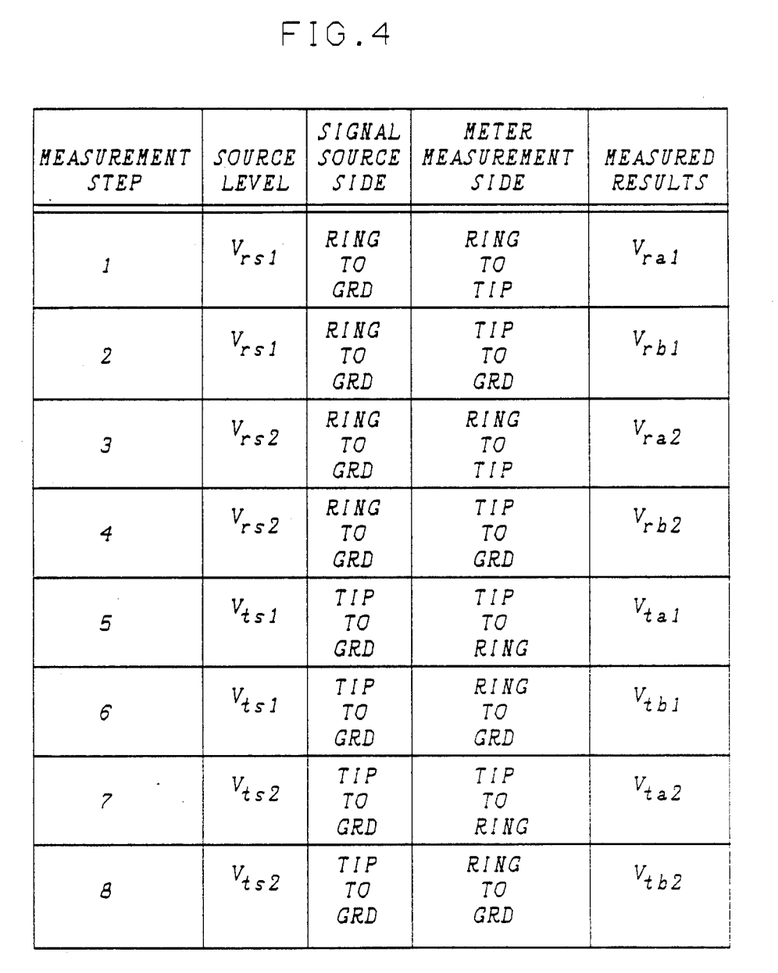
FIG. 4 is a table showing outlining the measurements taken in accordance with the present invention.

Refer now to FIG. 4 which outlines the steps of the present invention. At the outset, a predetermined voltage source and a serially connected predetermined, source protection resistor is sequentially connected between first and second preselected pairs of terminals. For purposes of illustration, we will assume that the two preselected pairs of terminals are tip-to-ground and ring-to-ground, it, of course, being understood that any two pairs of terminals could be selected. The value of the source protection resistor should be large enough to limit the current flowing through the source to a safe level. The voltages measured are used to determined the appropriate values of the source protection resistor for signal source connection between each pair of terminals. The determined value of the source protection resistor for each pair of terminals is used when performing succeeding measurements since a more accurate determination of the resistor values in the three-terminal equivalent network can be made when the resistance of the source protection resistor is closely matched to the equivalent resistance between the selected terminal pairs and yet be large enough to prevent a damage to the measurement equipment. Similarly, the value of the voltage source should be large enough to get accurate measurements while not causing a current flow in the circuit under test which exceeds the maximum levels. The appropriately valued source protection resistor corresponding to each of the preselected pairs of terminals is used in all of the measurement steps shown in FIG. 4.

As shown in step 1, signal source apparatus comprising a voltage source having a first predetermined level, $V_{rs1}$, and a serially connected protection resistor, $R_{p1}$, is applied across the ring and ground terminals and a voltage measurement between the ring and tip terminals is made, designated as $V_{ra1}$. Next, as shown by step 2, the signal source apparatus of step 1 is left unchanged and a voltage measurement between the tip and ground terminals, designated as $V_{rb1}$, is made. In steps 3 and 4, the signal source apparatus is left unchanged but set to another source level, $V_{rs2}$, and voltage measurements across ring to tip, $V_{ra2}$, and tip to ground, $V_{rb2}$, are made. Source levels $V_{rs1}$ and $V_{rs2}$ are selected so as to provide the maximum possible voltage swing between these levels. With these 4 measurements, the total resistance of the three terminal equivalent circuit viewed between the ring to ground terminals, $R_{x1}$, can be determined in accordance with the following relationship:

$$R_{x1} = \frac{(V_{ra1} - V_{ra2}) + (V_{rb1} - V_{rb2})}{(V_{rs1} - V_{rs2}) - (V_{ra1} - V_{ra2}) - (V_{rb1} - V_{rb2})} R_{p1} \quad (1)$$

and a ratio $K_2$ can be formed in accordance with the following expression:

$$K_2 = \frac{V_{rb1} - V_{rb2}}{V_{ra1} - V_{ra2}} \quad (2)$$

With the signal source apparatus connected between the ring and ground terminals, the current through resistors R2 and R12 is the same and $K_2$ is equal to the ratio of resistors R2/R12 in the absence of measurement error and the effect of the measurement meter's internal resistance. Since measurement error and internal resistance of a meter are always present to some extent, it can be said that the ratio $K_2$ is representative or is an estimate of the ratio of the values of resistors R2/R12.

In measurement steps 5 through 8, the signal source apparatus and serially connected source protection resistor, $R_{p2}$, are connected between the tip and ground terminals. In steps 5 and 6, a source level designated as $V_{ts1}$ is applied. The measurement meter is respectively connected between the tip and ring and ring and ground terminals to provide measurements $V_{ts1}$ and $V_{tb1}$. Finally, the procedure of steps 5 and 6 is respectively repeated in measurement steps 7 and 8 using an associated source level $V_{ts2}$ to determine the measurements $V_{ta2}$ and $V_{tb2}$. Source levels $V_{ts1}$ and $V_{ts2}$ are selected with the same guidelines used for $V_{rs1}$ and $V_{rs2}$. Using the measurements of steps 5–8, the total resistance, $R_{x2}$, of the three terminal equivalent network viewed between the tip and ground terminals and the ratio K1 can be determined, where $$R_{x2} = \frac{(V_{ta1} - V_{ta2}) + (V_{tb1} - V_{tb2})}{(V_{ts1} - V_{ts2}) - (V_{ta1} - V_{ta2}) - (V_{tb1} - V_{tb2})} R_{p2} \quad (3)$$

and $$K_1 = \frac{V_{tb1} - V_{tb2}}{V_{ta1} - V_{ta2}} \quad (4)$$

Again, with the signal source apparatus connected between tip and ground, the current through resistors R1 and R12 is the same and $K_1$ is an estimate of the ratio of resistors R1/R12. Furthermore, $K_1$ is equal to this resistor value ratio in the absence of measurement errors and the effect of the meter's internal resistance.

Using the derived quantities $K_1$, $K_2$, $R_{x1}$ and $R_{x2}$, the values of resistors R1, R2 and R12 can be readily determined. Specifically, $$R_1 = \left(\frac{1 + K_1 + K_2}{1 + K_2}\right)(R_{x1}) \quad (5)$$

$$R_2 = \left(\frac{1 + K_1 + K_2}{1 + K_1}\right)(R_{x2}) \quad (6)$$

and $$R_{12} = \left(\frac{1 + K_1 + K_2}{1 + K_2}\right)\left(\frac{R_{x1}}{K_1}\right) \quad (7)$$

or $$R_{12} = \left(\frac{1 + K_1 + K_2}{1 + K_1}\right)\left(\frac{R_{x2}}{K_2}\right). \quad (8)$$

Resistor $R_{12}$ in the illustrative three terminal equivalent circuit can be determined in accordance with equation 7 or 8. Preferably, the equation used should be the one wherein the ratio $K_1$ or $K_2$ in the second term of the equation, i.e., $$\frac{R_{x1}}{K_1} \text{ or } \frac{R_{x2}}{K_2},$$

has the smallest error. The error for the ratio $K_1$ or $K_2$ can be determined, in well-known fashion, from the known or estimated error associated with each measurement used to form the ratio. This ratio error determination is even simpler for certain three terminal equivalent circuits where the ratio with the smallest error is the ratio closest to one. Such is the case for a three terminal equivalent circuit including only resistors between the tip, ring and ground terminals.

With the values of $R_1$, $R_2$ and $R_{12}$ determined, the values of $E_1$ and $E_2$ can be readily determined from a number of different mathematical expressions. In one such expression, $$E_1 = V_{tb1} - \frac{V_{ta1}R_1}{R_{12}} \quad (9)$$

and $$E_2 = V_{rb1} - \frac{V_{ra1}R_2}{R_{12}}. \quad (10)$$

It should be noted that the presence of the meter's internal resistance during a measurement alters the element values of the three terminal equivalent circuit viewed from the test position. Furthermore, this alteration varies as the meter connections change from one pair of terminals to another. To avoid this meter effect, one or more compensating resistors, each having a value equal to that of the meter's internal resistance, is advantageously connected between one or more pairs of terminals so as to maintain the same equivalent circuit element values as the meter connections are changed. The effect of the compensating resistor, designated as $R_m$, can then be readily subtracted from the determinations of $R_1$, $R_2$ and $R_{12}$. In general, the values of any resistor corrected to the effect of $R_m$ can be expressed by $$R_n' = (R_n^{-1} - R_m^{-1})^{-1}; \quad (11)$$

where $R_n = R_1, R_2$ or $R_{12}$; and $R_n'$ is the corresponding resistor value corrected for the addition of compensating resistor $R_m$. Similarly, the values of $E_1$ and $E_2$ can be corrected for the presence of $R_m$ by the expression.

$$E_n' = \left(\frac{R_m + R_n}{R_m}\right)E_n; \text{ where} \quad (12)$$

$n = 1$ or 2; and $E_n'$ is the corresponding battery value corrected for the presence of $R_m$.

The present invention can be adapted to compensate for different sources of measurement error. For example, in certain applications the value of resistor $R_{12}$ is very much greater than the values of the resistors $R_1$ and $R_2$ and the values of $E_1$ and $E_2$ exceed a predetermined threshold value. In such an event, a measurement error has occurred due to the bias effect of a battery element in the three terminal equivalent circuit. This error can be reduced by employing a bias compensation technique which utilizes additional measurements to improve the accuracy of the determined value of resistor $R_{12}$. Pursuant to this technique, the ratio $K_1$ and $K_2$ having the largest value is selected, and certain measurements used in calculating the selected ratio are repeated using a biasing voltage. The repeated measurements are those which were made between a pair of terminals whose directly interconnecting equivalent circuit path includes a battery element. Specifically, if ratio $K_1$ is selected, measurement steps 6 and 8 are repeated with a biasing voltage in series with the measurement meter. The value of the biasing voltage is equal to the determined value of element $E_1$ or the average value of $V_{tb1}$ and $V_{tb2}$.

If ratio $K_2$ is selected, measurement steps 2 and 4 are repeated with a biasing voltage equal to the determined value of element $E_2$ or the average of $V_{rb1}$ and $V_{rb2}$ serially connected to the measurement meter. Using these two additional measurements, the value of the selected ratio is recalculated and then the value of element $R_{12}$ is calculated using the equation in which the selected ratio appears in the denominator of the second term.

Another situation in which the accuracy of the determined circuit element values can be further improved arises when $R_{12}$ is very much less than $R_1$ and $R_2$ and ratios $K_1$ and $K_2$ each have an unacceptable error. Then, it is advantageous to utilize a ratio reduction technique. In this technique, one of the ratios $K_1$ or $K_2$ is arbitrarily selected and the measurement steps used to form the selected ratio are repeated. These measurements are preferbly repeated with a source protection resistor having a revised value to reflect the addition of the external resistor. Specifically, for ratio $K_1$, measurement steps 5 through 8 are repeated with an external resistor coupled between the ring and ground terminals. Similarly, for ratio $K_2$, measurement steps 1 through 4 are repeated with an external resistor coupled between the tip and ground terminals. In either case, the value of the external resistor should be small enough to reduce the value of the selected ratio below a preselected maximum value.

The above-described bias compensation and ratio reduction technique can be incorporated together into the present invention or, in certain applications, either one alone may be so incorporated.

Figure 5:
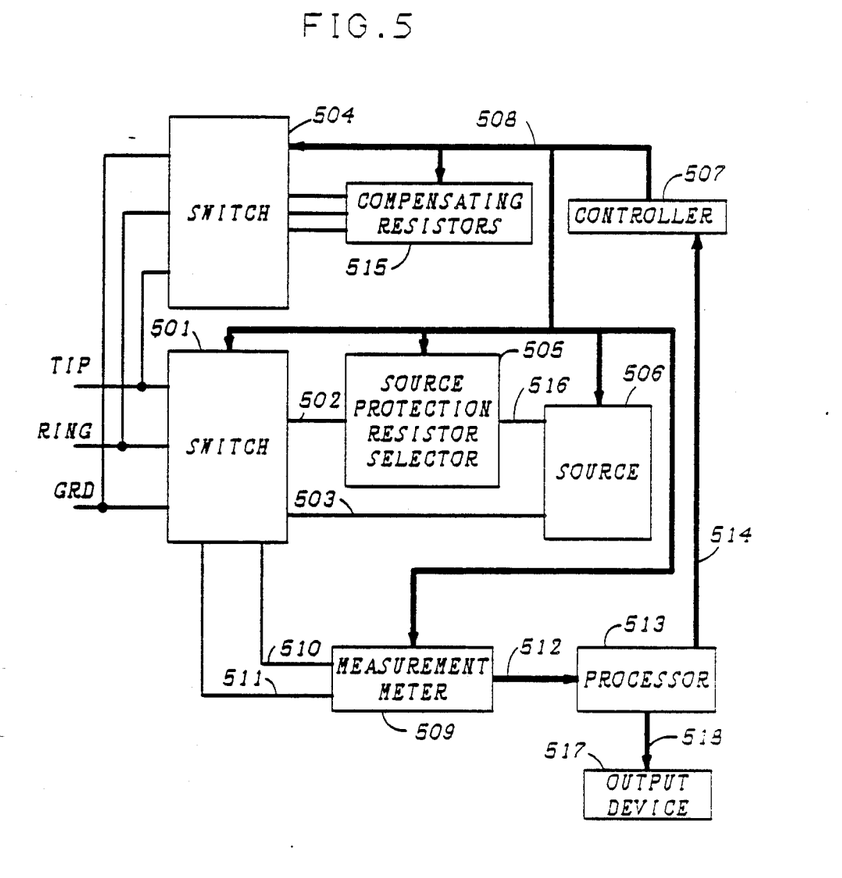
FIG. 5 is a schematic block diagram of apparatus in accordance with the present invention.

FIG. 5 shows a block-schematic diagram of apparatus which performs the measurement methodology described hereinabove for a three terminal equivalent circuit. At the beginning of testing, controller 507 directs switch 501, via bus 508, to connect measurement meter 509 across the ring to ground and tip to ground terminals to provide a pair of voltage measurements. Then, a predetermined DC voltage is provided by source 506 across leads 503 and 516 and a predetermined resistor from source protection resistor selector 505 is inserted between leads 502 and 516. Switch 501, controlled by controller 507 via bus 508, respectively connects leads 502 and 503 to the ring and ground terminals and then to the tip and ground terminals. In addition, switch 501 sequentially connects leads 510 and 511 of measurement meter 509 to these terminal pairs to provide a pair of voltage measurements. For these four measurements and for those to be described, switch 504 advantageously connects one or more compensating resistors from compensating resistor selector 515. Each resistor having a value equal to the internal resistance of the measurement meter, is connected between selected pairs of terminals so as to maintain the same equivalent circuit element values as the meter connections are changed.

The four voltage measurements provided by meter 509 are coupled via bus 512 to processor 513 which determines the total resistance of the three terminal equivalent circuit between the ring and ground terminals and between the tip and ground terminals. Processor 513 then selects a resistor having the closest value to each determined total resistance from a plurality of preselected resistors in selector 505. The selections made and the appropriate levels for source 506 are communicated to controller 507 via bus 514. Controller 507 directs selector 505 to insert a selected resistor between leads 502 and 516 when the source is coupled between a corresponding pair of circuit terminals.

With the appropriate source protection resistor inserted, controller 507 via bus 508 sequentially directs switch 501 to provide the source and measurement meter connections as set for in measurement steps 1-8 of FIG. 4. Controller 507 also controls the voltage level of source 506 and the operation of meter 509 for these steps via bus 508. In addition, controller 507 advantageously controls the operation of switch 504 so as to provide compensating resistors across the terminals during the measurement steps which maintain the same equivalent circuit element values as the meter connections are changed.

Processor 513 determines the values of $R_{x1}$, $R_{x2}$, $K_1$ and $K_2$ and thence the circuit element values. The determined values are then examined by processor 513, and if they don't fall within predetermined categories, the determined values are coupled via bus 518 to output device 517. If however, the determined values fall within these categories, then either the bias compensation or the ratio reduction technique is instituted to further improve the accuracy of the determined value of $R_{12}$. The appropriate technique to use along with the source levels, necessary biasing voltage external resistor value, source protection resistor value, and source and meter connections are communicated to controller 507 via bus 514. The required biasing voltage is provided within meter 509 under the control of controller 507. In addition, compensating resistor selector 515 provides the approximately-valued external resistor for the ratio reduction via signals on bus 508 from controller 507.

Figure 6:
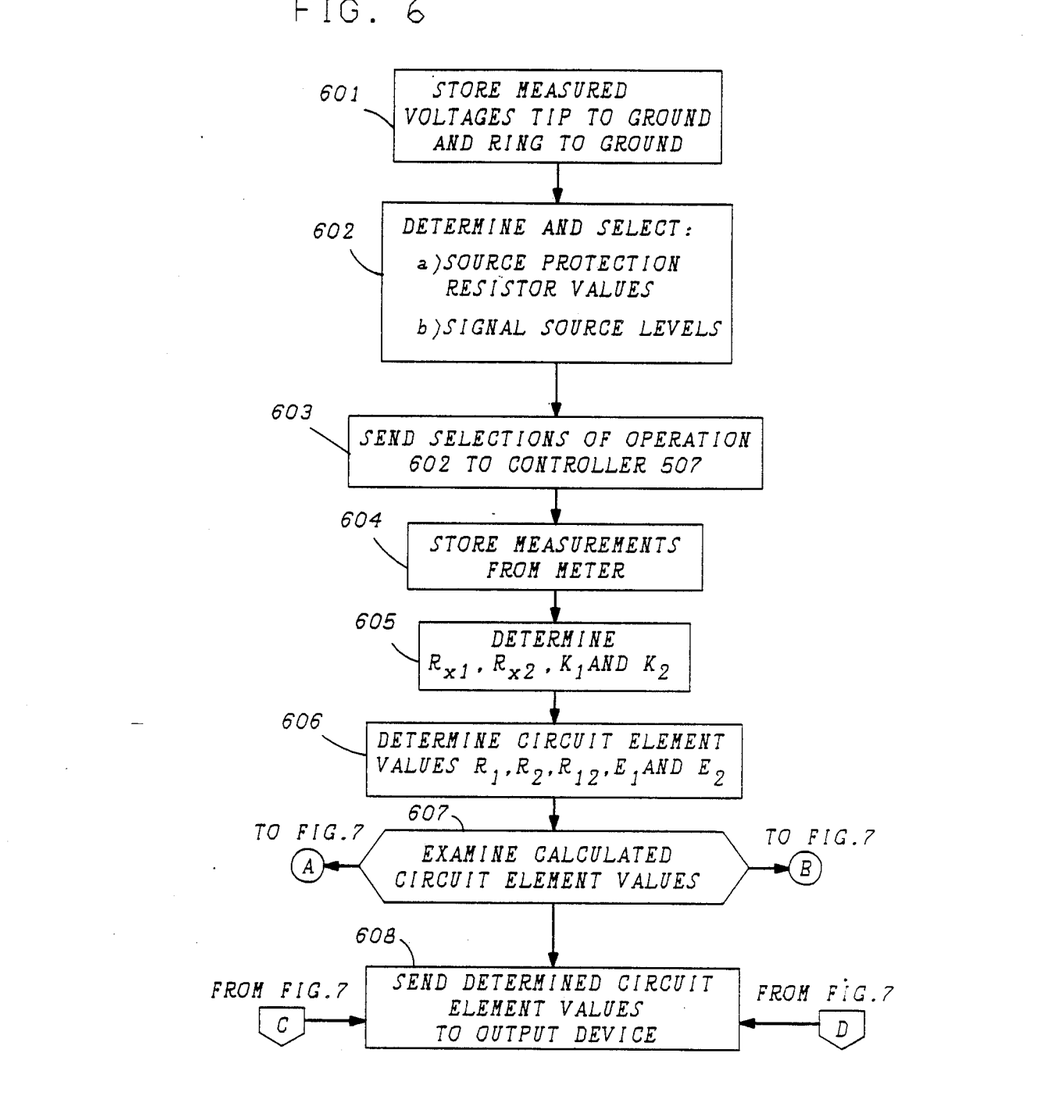
FIGS. 6 and 7 are a flow chart outlining the operations of the processor in FIG. 5.
Figure 7:
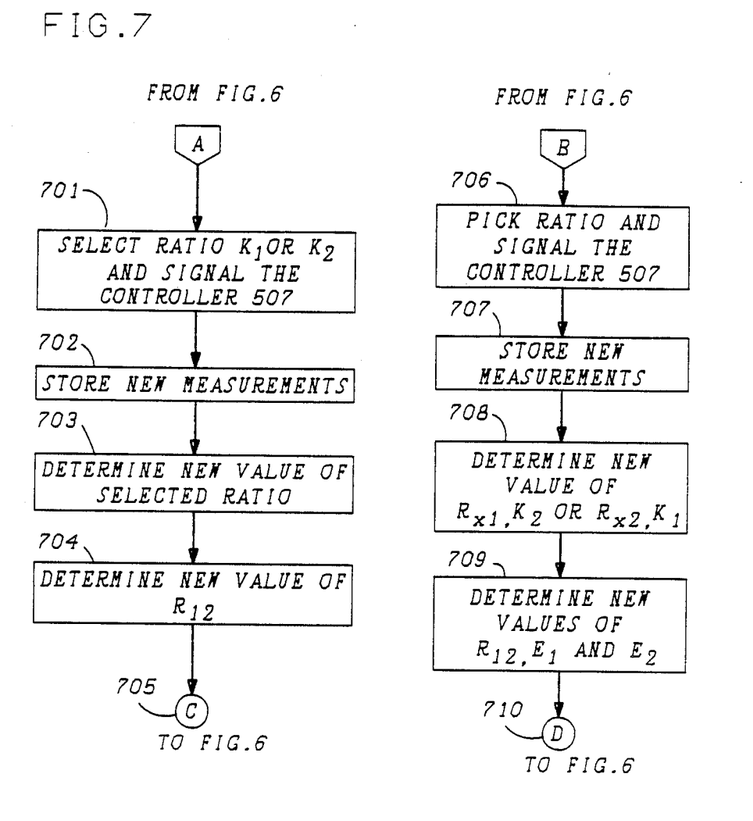

FIGS. 6 and 7 set forth the operations of processor 513. As shown by operations 601-603, the four tip to ground and ring to ground voltages are stored and the values of the source protection resistors for ring to ground and tip to ground source connections are calculated. A selection of the closest one of a plurality predetermined resistors in selector 505 and the appropriate signal source levels are then made and communicated to controller 507 via bus 514. The measurements made during steps 1-8 are supplied by bus 512 to processor 513 and stored therein as shown by operation 604. These stored measurements are then selectively used, as shown by operation 605, to calculate the equivalent resistances $R_{x1}$ and $R_{x2}$ and the ratios $K_1$ and $K_2$ as previously described. These four quantities, as depicted by operation 606, are used to determine the values of all the circuit elements.

Operation 607 designates the examination of the relative values of the circuit element values to determine whether the bias compensation or ratio reduction technique should be applied. If not, the determined results are coupled, as illustrated by operation 608 to the output device. If the bias compensation technique should be applied, operations 701-705 illustrate the sequentially steps provided by processor 513. Similarly, operations 706-710 illustrate the sequential procedures performed by processor 513 when the ratio reduction technique is used.

The present invention can also be applied after conventional techniques have been used to determine the described circuit element values and one or more of said values is inaccurate. In one possible application, only one resistor value is incorrect and the present invention can be used to correct this value. In such case, only one ratio need be formed from the associated measurements. The inaccurate circuit element value is then corrected using this ratio.

It should, of course, be understood that while the present invention has been disclosed in reference to a particular embodiment which determines the circuit element values of an illustrative three terminal equivalent circuit, numerous variations should be apparent to those skilled in the art. First, while the illustrative equivalent circuit comprises resistors and batteries, the invention is also applicable to an equivalent circuit comprising only resistors and for which measurement steps 3, 4, 7 and 8 can be deleted and the corresponding measured results set to zero. Second, while a voltage source is applied and corresponding measurements are taken, a current source could be applied and corresponding mesurements could be made. Finally, while the present invention has been described in reference to the DC characterization of a three terminal equivalent circuit, an AC characterization can also be provided. In an AC characterization, the circuit elements are impedances having a real and imaginary part. The signal applied to the three terminal equivalent circuit is from an AC source and the measurements taken involve the use of a demodulator and equipment which determines the magnitude and phase of the AC signal between the described circuit terminals. The computations in an AC characterization are the same as those disclosed except that for an AC characterization complex numbers are involved instead of the real numbers manipulated in a DC characterization.

What is claimed is:

1. Apparatus for determining the electrical values of circuit elements in a three terminal equivalent circuit, said equivalent circuit being representative of an actual communications network, said apparatus comprising means for applying predetermined signals to said actual communications network and measuring the electrical effects in response thereto;

means for forming at least one ratio, the numerator and denominator of each ratio being a different function of at least one of said measured effects and each ratio being representative of the value of one preselected circuit element to another in said equivalent circuit; and means for determining the electrical values of said circuit elements in response to at least one of said formed ratios.

2. The apparatus of claim 1 wherein said applying means couples a protective element to said network.

3. The apparatus of claim 1 wherein said applying means includes a measurement meter having an internal resistance.

4. The apparatus of claim 3 wherein said applying means also includes means for coupling an auxiliary circuit element to said network to compensate for said internal resistance.

5. The apparatus of claim 1 wherein said determining means examines said circuit element values and determines when these values fall within at least one predetermined range.

6. The apparatus of claim 5 wherein said determining means directs said applying means to apply additional signals to said network and measure the electrical effects in response thereto when said values fall in said range.

7. The apparatus of claim 6 wherein said applying means applies an external circuit element to said network when measuring the electrical effects of said additional signals.

8. The apparatus of claim 6 wherein said applying means applies a biasing signal to said network when measuring the electrical effects of said additional signals.

9. The apparatus of claim 6 wherein said determining means revises certain ones of said circuit element values in response to the measured electrical effects of said additional signals.

10. A method of determining the electrical values of circuit elements in a three terminal equivalent circuit, said equivalent circuit being representative of an actual communications network, said method comprising the steps of applying predetermined signals to said actual communications network and measuring the electrical effects in response thereto;

forming at least one ratio using processor apparatus, the numerator and denominator of each ratio being a different function of at least one of said measured effects and each ratio being representative of the value of one preselected circuit element to another in said equivalent circuit; and determining the electrical values of said circuit elements in response to at least one of said formed ratios using said processor apparatus.

11. The method of claim 10 further including the step of coupling a protective circuit element to said network when applying said predetermined signals.

12. The method of claim 10 wherein the measuring of the electrical effects of said applied signals on said network is made with a meter having an internal resistance.

13. The method of claim 12 further including the step of coupling an auxiliary circuit element to said network which compensates for said internal resistance when applying said predetermined signals.

14. The method of claim 10 further including the step of determining when the circuit element values fall within at least one predetermined range.

15. The method of claim 14 further including the step of applying additional signals to said network and measuring the response thereto when said values fall in said range.

16. The method of claim 15 further including the step of coupling an external circuit element to said network when measuring the electrical effects of said additional signal.

17. The method of claim 15 further including the step of applying a biasing signal to said network when measuring the electrical effects of said additional signal.

18. The method of claim 15 further including the step of revising certain ones of said circuit element values in response to measuring the electrical effects of said additional signals.

19. The apparatus of claim 1 wherein each ratio formed by said forming means is proportional to the electrical value of one preselected circuit element to another in said equivalent circuit.

20. The method of claim 10 wherein each formed ratio is proportional to the electrical value of one preselected circuit element to another in said equivalent circuit.

* * * * *